United States Patent
Chen

[19]

[11] Patent Number: 5,828,222
[45] Date of Patent: Oct. 27, 1998

[54] QUICK DC COMPRESSIVE STRENGTH TEST METHOD AND THE RELATED APPARATUS

[75] Inventor: Pin-Yi Chen, Taipei, Taiwan

[73] Assignees: Extech Electronics Co., Ltd., Taipei, Taiwan; Associated Research, Inc., Lake Bluff, Ill.

[21] Appl. No.: 869,037

[22] Filed: Jun. 5, 1997

[51] Int. Cl.[6] .................................................. G01R 27/26
[52] U.S. Cl. .......................... 324/678; 324/672; 324/548
[58] Field of Search ..................................... 324/658, 665, 324/672, 678, 679, 684, 519, 548, 551; 340/662, 663, 664

[56] References Cited

U.S. PATENT DOCUMENTS

| | | | |
|---|---|---|---|
| 3,268,809 | 8/1966 | Meyer et al. | 324/548 |
| 3,414,792 | 12/1968 | Mui et al. | 324/548 |
| 4,697,151 | 9/1987 | Butler | 324/123 R |
| 5,202,640 | 4/1993 | Schaaf et al. | 324/678 |
| 5,510,719 | 4/1996 | Yamamoto | 324/678 |
| 5,652,521 | 7/1997 | Meyer | 324/551 |
| 5,677,634 | 10/1997 | Cooke et al. | 324/678 |

*Primary Examiner*—Diep N. Do
*Attorney, Agent, or Firm*—Bacon & Thomas

[57] ABSTRACT

An output open circuit test method including the steps of inputting the data of a predetermined charging current upper limit value and a predetermined test voltage and a predetermine test charging current time zone into a test apparatus, then employing a high voltage to the test sample, and then driving the test apparatus to measure the current between two ends of the test sample and to compare the measured current value with the predetermined charging current upper limit value, and then letting the test apparatus to start testing the leakage current of the test sample when the measured current value is below the predetermined charging current upper limit value.

6 Claims, 3 Drawing Sheets

QUICK DC COMPRESSIVE STRENGTH TEST METHOD AND THE RELATED APPARATUS

BACKGROUND OF THE INVENTION

The present invention relates to a quick DC dielectric voltage-withstand test method for testing the ability of a load to voltage-withstand application of a high voltage by setting a predetermined charging current upper limit value in addition to the usual predetermined leakage current upper limit value in the test apparatus as test standards for quick quality testing.

A load generally has a capacitive reactance. When performing a DC dielectric voltage-withstand test by applying a test voltage to two opposite ends of the load, a charging current is produced at the load. After charging, a stable leakage current value exists in the load. Because conventional DC dielectric voltage-withstand test apparatus have only a leakage current upper limit value, the voltage supplied must be gradually increased to the test voltage value at a low speed to prohibit the load from producing a charging current over the defined leakage current upper limit value. Because the voltage supplied must be gradually increased to the test voltage value at a low speed, the test speed of conventional DC compressive strength test apparatus is slow.

SUMMARY OF THE INVENTION

The present invention provides a quick DC dielectric voltage-withstand test method which eliminates the aforesaid problem. It is one object of the present invention to provide a quick DC dielectric voltage-withstand test method which detects the charging current of the test sample within a set length of time, compares the measured current value with a predetermined charging current upper limit value, and letting the test apparatus to quickly boost the supplied voltage to the set test voltage and to start testing the leakage current of the test sample when the measured current value is below the predetermined charging current upper limit value. It is another object of the present invention to provide a quick DC dielectric voltage-withstand test apparatus which is comprised of a microprocessor, a status display and a test circuit, and which starts to test the leakage current of the test sample only when the charging current measured at the test sample is below the set charging current upper limit value.

DETAILED DESCRIPTION OF THE PREFERRED EMBODIMENT

Figure 1:
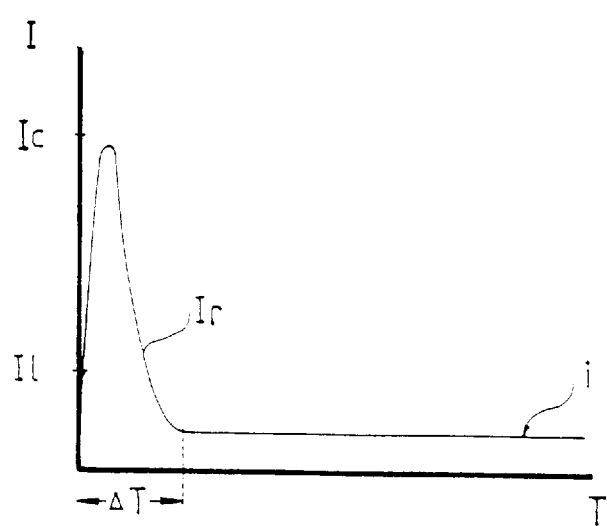
FIG. 1 is a current-time curve showing the relationship between time and current after the application of a high voltage to a capacitive reactance test sample.

According to the physical property of a load, it has a certain capacitive reactance value. When a high voltage power supply is employed to the load, it charges the load, causing an instant charging current to be produced (see FIG. 1). Further, after charging of the high voltage power supply to the load, a certain amount of leakage current is maintained at the load subject to the material property of the load.

The present invention utilizes the aforesaid physical property to set a charging current upper limit value Ic, a predetermined test charging current time zone $\Delta T$ and a test voltage value V in the test apparatus before starting to test the test sample. The charging current upper limit value Ic is the lowest charging current value produced at the test sample after the application of a high voltage to the test sample which is below the set test voltage value V. The test charging current time zone $\Delta T$ means a certain time range in which a charging current is produced at the test sample to make a charging action after the application of a high voltage power supply to the test sample. The charging current upper limit value Ic and the test charging current time zone $\Delta T$ are determined subject to the material property of the test sample and the value of the test voltage V.

Figure 2:
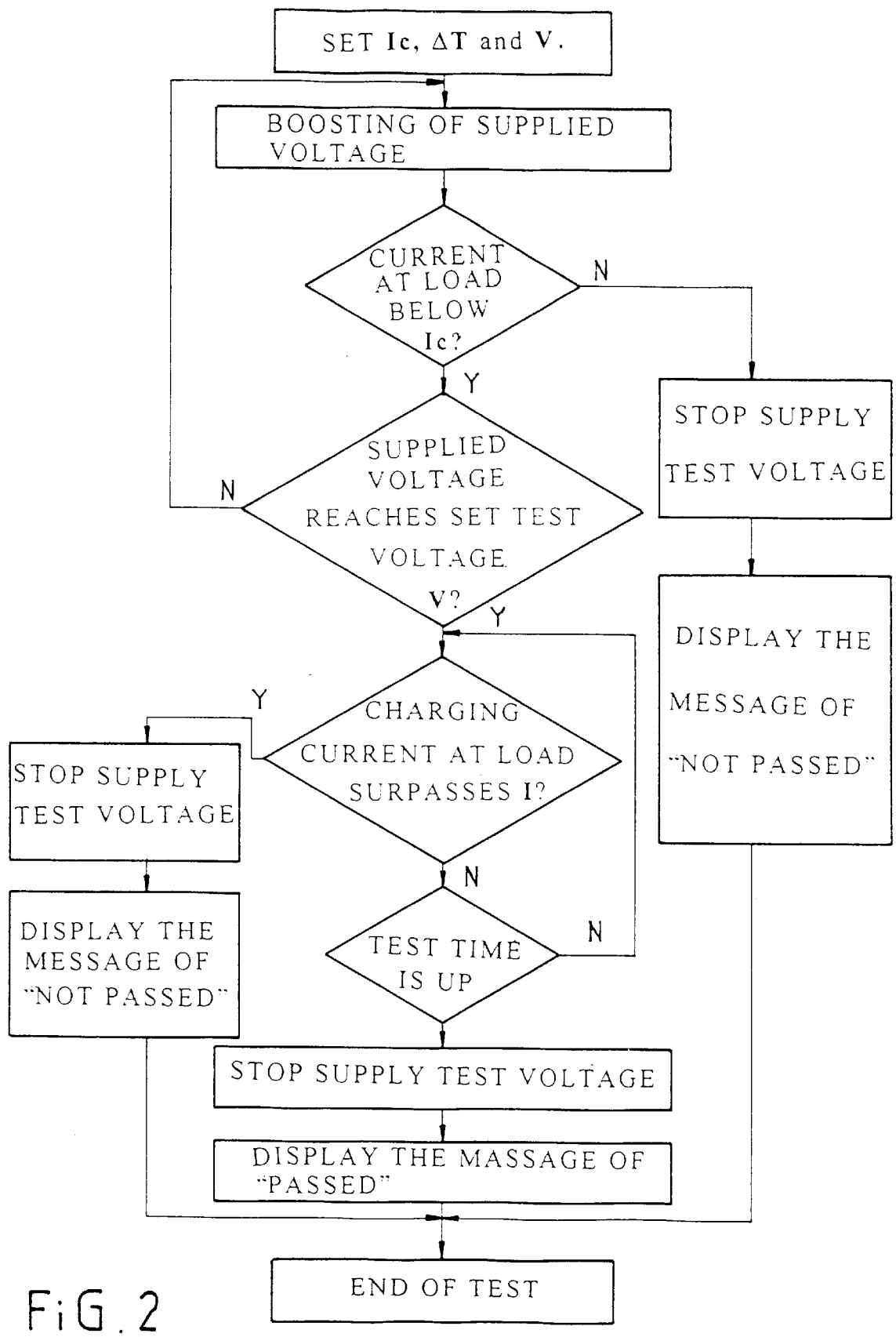
FIG. 2 is a flow chart explaining the performance of the method of the present invention.

The test procedure of the present invention is outlined hereinafter with reference to FIG. 2. At first, the charging current upper limit value Ic, the test voltage V, the test charging current time zone $\Delta T$ and the leakage current upper limit value Il are set in the test apparatus. The leakage current upper limit value Il means the upper limit reference value which conforms to the safety rules. Then, the test apparatus provides a voltage to two opposite ends of the test sample through its two test ends, and measures the continuous current value Ir between the two test ends of the test apparatus within the test charging current time zone $\Delta T$. The voltage supplied is linearly raised during the time zone $\Delta T$, after which the voltage is maintained at the test voltage value V so that the test apparatus can use the test voltage V to test the test sample. The measured continuous current value Ir is then compared with the charging current upper limit value Ic. If the measured continuous current value Ir surpasses the charging current upper limit value Ic, the test sample may be short-circuited or there are abnormal factors existed, and the test apparatus shows the test result of the test sample as not passed.

If the measured continuous current value Ir is below the charging current upper limit value Ic during the boosting of the supplied voltage, the test apparatus keeps raising the supplied voltage to the set test voltage value V and then testing the test sample to check if the leakage current i of the test sample is below the leakage current upper limit value Il.

Figure 3:
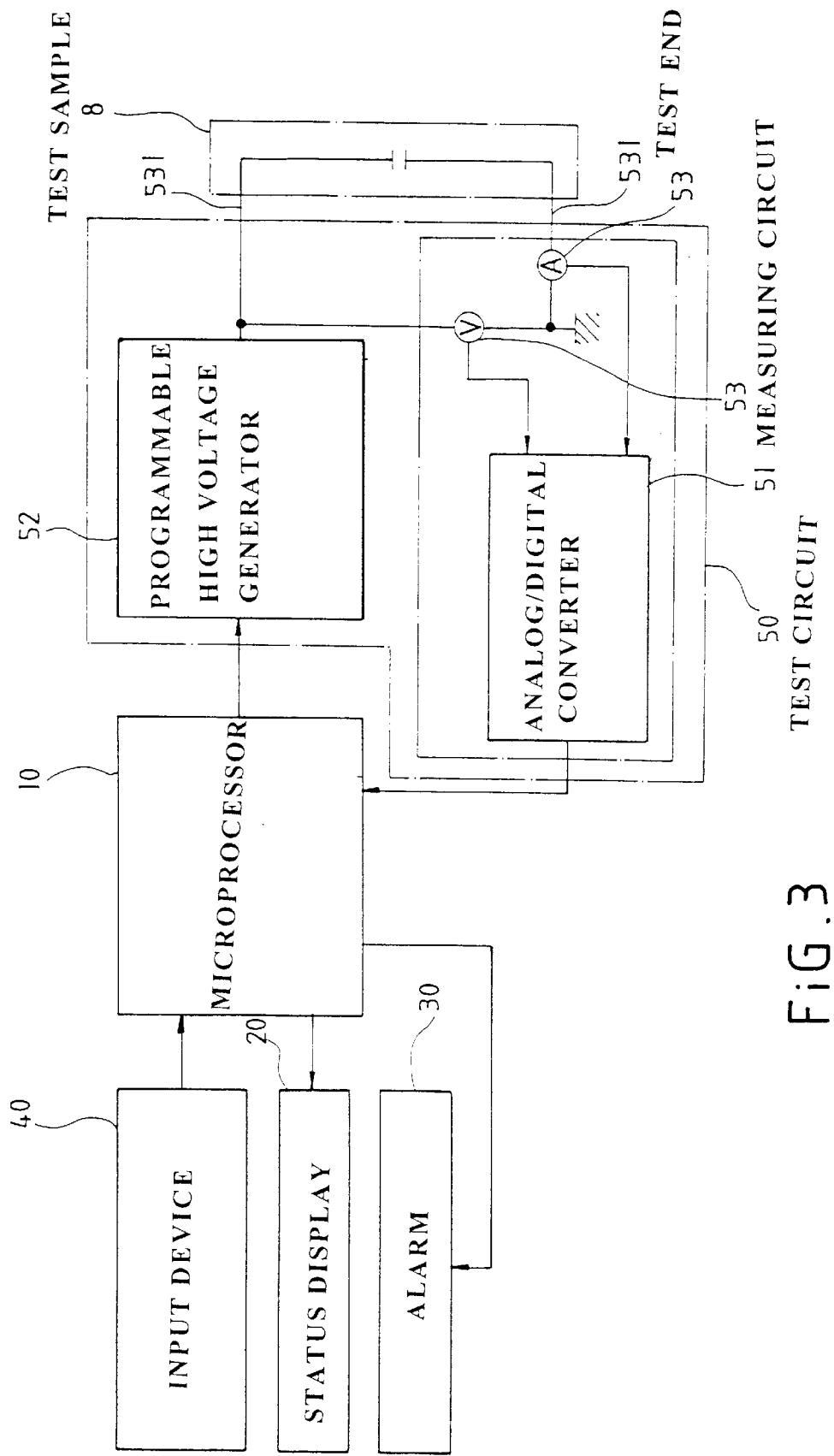
FIG. 3 is a circuit block diagram of a test apparatus according to the present invention.

Referring to FIG. 3, the test apparatus comprises a microprocessor (CPU or MPU) 10, a status display 20, an alarm (for example a siren) 30, an input device (for example a keyboard) 40, and a test circuit 50. The test circuit 50 is comprised of an analog/digital converter 51, a programmable high voltage generator 52, and a measuring circuit 53. The measuring circuit 53 can be an ampere meter or voltmeter.

During test, the test sample 8 is connected to the two test ends 531 of the measuring circuit 53, then the charging current upper limit value Ic, the test voltage V, the test charging current time zone $\Delta T$ and the leakage current upper limit value Il are inputted into the microprocessor 10 through the input device 40, and then the microprocessor 10 is started to drive the programmable high voltage generator 52, causing it to provide a high voltage to the test sample 8. Within the test charging current time zone $\Delta T$, the supplied voltage from the programmable high voltage generator 52 is raised from zero volt to the test voltage V to drive the measuring circuit 53, causing it to measure the charging current Ir between its two test ends 531. If the value of the charging current Ir is below the charging current upper limit value Ic, the microprocessor 10 immediately starts to measure the leakage current i of the test sample 8. The analog signal of the leakage current i thus measured is then transmitted from the measuring circuit 53 to the analog/digital converter 51 and then converted by it into a digital signal.

The digital signal of the leakage current i thus obtained is then sent to the microprocessor 10 for comparison with the set leakage current upper limit value Il.

If the comparison result shows that the value of the leakage current i is below the set leakage current upper limit value Il within the test charging current time zone ΔT, the microprocessor 10 immediately stops the programmable high voltage generator 61 from supplying the voltage to the measuring circuit 53, and shows the message through the status display 20.

If the comparison result shows that the value of the leakage current i surpasses the set leakage current upper limit value Il within the test charging current time zone ΔT, the microprocessor 10 immediately stops the programmable high voltage generator 61 from supply the voltage to the measuring circuit 53, shows the message through the status display 20, and provides a warning signal through the alarm 30, informing the user that the test sample 8 does not pass the test.

While only one embodiment of the present invention has been shown and described, it will be understood that various modifications and changes could be made thereunto without departing from the spirit and scope of the invention disclosed.

What the invention claimed is:

1. A DC dielectric voltage-withstand test method comprising the steps of:
   (a) preparing a test apparatus, then setting a predetermined test voltage which is to be applied to a test sample, a predetermined test charging current time interval ΔT during which charging currents are present and no leakage current measurement is performed, and a predetermined charging current upper limit value of Ic in said test apparatus, said charging current upper limit value Ic being a maximum acceptable charging current value set by the user;
   (b) operating said test apparatus to measure the charging current value Ir between two opposite ends of said test sample during said test charging current time interval ΔT;
   (c) operating said test apparatus to compare the measured charging current value Ir with said predetermined charging current upper limit value Ic; and
   (d) permitting said test apparatus to start testing the leakage current i of said test sample at said test voltage after said time interval ΔT has elapsed when the measured charging current value Ir remains below said predetermined charging current upper limit value Ic during said time interval ΔT, and stopping said test apparatus from testing the leakage current of said test sample and driving said test apparatus to show the non-approval status of said test sample if the measured charging current value Ir surpasses said predetermined charging current upper limit value Ic.

2. A DC dielectric voltage-withstand test apparatus comprising:
   a microprocessor;
   a status display controlled by said microprocessor to display a test status; and
   a test circuit controlled by said microprocessor to test a sample to be tested, said test circuit comprising a programmable high voltage generator having an input end connected to an output end of said microprocessor and an output end, an analog/digital converter having an input end connected to the output end of said high voltage generator and an output end connected to an input end of said microprocessor;
   wherein said microprocessor includes inputs by which a predetermined charging current upper limit value Ic, said charging current upper limit value Ic being a maximum acceptable charging current value set by the user, a predetermined test charging current time interval ΔT during which charging currents are presumed to occur and no leakage current test is conducted, and a predetermined test voltage V to be applied to the sample, are inputted into said microprocessor before a leakage test, said high voltage generator being driven by said microprocessor to provide a high voltage to the test sample within said predetermined test charging current time interval ΔT, said high voltage causing a charging current Ir to flow between opposite ends of said test sample, and
   wherein said test circuit is arranged to measure the charging current value Ir and said microprocessor is arranged to compare the measured current value Ir with said predetermined charging current upper limit value Ic and prevent the leakage test from being performed if said measured current value exceeds said upper limit value.

3. The DC dielectric voltage-withstand test apparatus of claim 2, wherein said measuring circuit is an ampere meter.

4. The DC dielectric voltage-withstand test apparatus of claim 2, wherein said measuring circuit is a voltmeter.

5. The DC dielectric voltage-withstand test apparatus of claim 2, wherein said microprocessor is a CPU (central processing unit).

6. The DC dielectric voltage-withstand test apparatus of claim 2, wherein said microprocessor is a micro controller.

* * * * *